(12) United States Patent
Jo et al.

(10) Patent No.: US 10,346,301 B2
(45) Date of Patent: Jul. 9, 2019

(54) MEMORY SYSTEM AND METHOD FOR OPERATING THE SAME

(71) Applicant: SK hynix Inc., Gyeonggi-do (KR)

(72) Inventors: Sang-Gu Jo, Gyeonggi-do (KR); Yong-Ju Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/653,990

(22) Filed: Jul. 19, 2017

(65) Prior Publication Data

US 2018/0107597 A1     Apr. 19, 2018

(30) Foreign Application Priority Data

Oct. 19, 2016  (KR) ........................ 10-2016-0135667

(51) Int. Cl.

| | | |
|---|---|---|
| *G06F 12/0804* | (2016.01) | |
| *G06F 12/06* | (2006.01) | |
| *G06F 13/16* | (2006.01) | |
| *G11C 11/34* | (2006.01) | |
| *G11C 11/407* | (2006.01) | |
| *G11C 29/44* | (2006.01) | |
| *G11C 29/00* | (2006.01) | |

(52) U.S. Cl.
CPC .......... *G06F 12/0804* (2013.01); *G06F 12/06* (2013.01); *G06F 13/1647* (2013.01); *G06F 13/1668* (2013.01); *G11C 11/34* (2013.01); *G11C 11/407* (2013.01); *G11C 29/4401* (2013.01); *G11C 29/72* (2013.01); *G11C 29/83* (2013.01)

(58) Field of Classification Search
None
See application file for complete search history.

(56) References Cited

U.S. PATENT DOCUMENTS 7,394,689 B2    7/2008  Ryu
2008/0091988 A1*  4/2008  Yoel ........................ G11C 29/24
                                                              714/711

* cited by examiner

*Primary Examiner* — James G Norman
(74) *Attorney, Agent, or Firm* — IP & T Group LLP

(57) ABSTRACT

A memory system includes: a memory device; and a memory controller suitable for controlling the memory device, and the memory device includes: a plurality of normal memory cells; a plurality of redundant memory cells; and a soft repair circuit suitable for replacing a portion of normal memory cells among the plurality of the normal memory cells with the plurality of the redundant memory cells, and the memory controller controls the soft repair circuit to repair the portion of the normal memory cells among the plurality of the normal memory cells with the plurality of the redundant memory cells, commands the memory device to write a secure data in the plurality of the redundant memory cells, and controls the soft repair circuit to recover the repairing of the portion of the normal memory cells with the plurality of the redundant memory cells.

12 Claims, 2 Drawing Sheets

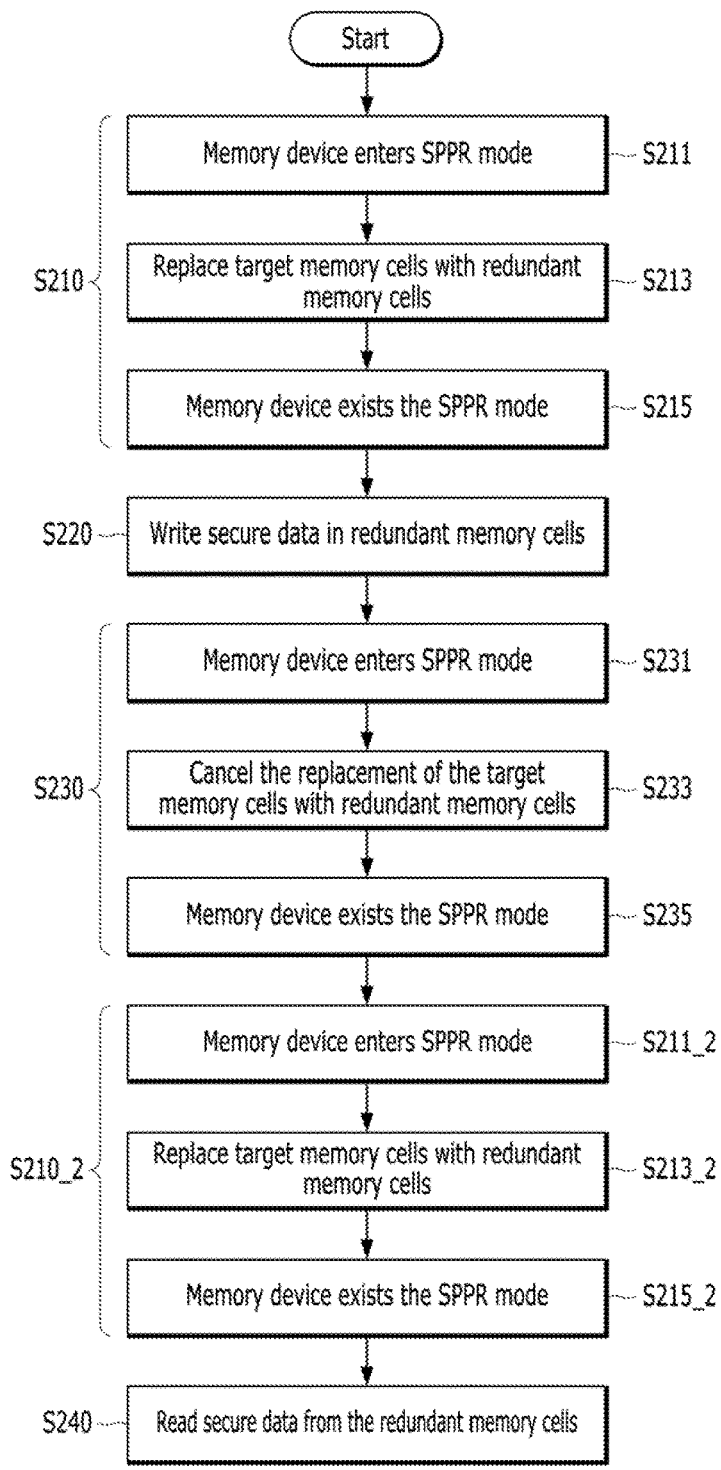

_US 10,346,301 B2_

MEMORY SYSTEM AND METHOD FOR OPERATING THE SAME

CROSS-REFERENCE TO RELATED APPLICATIONS

The present application claims priority to Korean Patent Application No. 10-2016-0135667, filed on Oct. 19, 2016, which is incorporated herein by reference in its entirety.

BACKGROUND

1. Field

Exemplary embodiments of the present invention relate to a memory device, and more particularly, to a repair operation of a memory device.

2. Description of the Related Art

In the early stage of the semiconductor memory device industry, there were many original good dies, which means memory chips produced after going through a semiconductor fabrication process have no defective memory cells on the wafers. However, as the capacity of memory devices increases, it becomes difficult to fabricate a memory device that does not have any defective memory cells. That is, there is little possibility that a memory device can be fabricated without any defective memory cells.

To address this concern, a repair method of providing redundancy memory cells in a memory device and replacing defective memory cells with the redundancy memory cells has been proposed.

Generally, when a process of fabricating a wafer of a memory device is completed, a test is performed on the wafer to decide whether or not the memory cells operate normally. After the test, memory cells that are defective are replaced with repair memory cells in the wafer state through a repair operation. This is a normal repair operation that is performed in the wafer state. Differently from the normal repair operation, there is a Post-Package repair operation (PPR) which is a repair operation performed after the memory device is packaged. With the post-package repair operation, it is possible to repair defective memory cells that are not detected in the wafer state but are detected when a user uses the memory device after the memory device is packaged.

The post-package repair operation includes a hard post-package repair operation and a soft post-package repair operation. The hard post-package repair operation is a repair operation, the effect of which lasts permanently once the post-package repair operation is performed. The soft post-package repair operation is a temporary repair operation, the effect of which disappears when power is not supplied to the memory device. For example, when a hard post-package repair operation is performed to replace a particular memory cell X with a redundant memory cell Y, the memory cell X is permanently replaced with the redundant memory cell Y. However, when a soft post-package repair operation is performed to replace the memory cell X with the redundant memory cell Y, the repair operation for the memory cell X has to be repeatedly performed whenever power is newly supplied to the memory device.

SUMMARY

Embodiments of the present invention are directed to a method for storing secure data in a memory device based on a repair technology.

In accordance with an embodiment of the present invention, a method for operating a memory device includes: repairing first normal memory cells of normal memory cells with redundant memory cells; writing a secure data in the redundant memory cells; and recovering the repairing of the first normal memory cells with the redundant memory cells.

The repairing of the first normal memory cells of the normal memory cells with the redundant memory cells may include: entering a soft post-package repair operation mode; replacing the first normal memory cells with the redundant memory cells; and exiting the soft post-package repair operation mode.

The writing of the secure data in the redundant memory cells may include: receiving a write command and an address designating the first normal memory cells from a memory controller; and writing the secure data in the redundant memory cells based on the write command and the address.

The recovering of the repairing of the first normal memory cells with the redundant memory cells may include: entering a soft post-package repair operation mode; canceling the repairing of the first normal memory cells with the redundant memory cells; and ending the soft post-package repair operation mode.

After the recovering of the repairing of the first normal memory cells with the redundant memory cells, the method may further include: repairing second normal memory cells of the normal memory cells with the redundant memory cells; and reading the secure data from the redundant memory cells.

The repairing of the second normal memory cells of the normal memory cells with the redundant memory cells may include: entering a soft post-package repair operation mode; replacing the second normal memory cells with the redundant memory cells; and exiting the soft post-package repair operation mode.

The reading of the secure data from the redundant memory cells may include: receiving a read command and an address designating the second normal memory cells from a memory controller; and reading the secure data from the redundant memory cells based on the read command and the address.

In accordance with another embodiment of the present invention, a memory system may comprise: a memory device; and a memory controller suitable for controlling the memory device, and the memory device comprises: a plurality of normal memory cells; a plurality of redundant memory cells; and a soft repair circuit suitable for repairing first normal memory cells of the normal memory cells with the redundant memory cells, wherein, the memory controller controls the soft repair circuit to repair the first normal memory cells with the redundant memory cells, controls the memory device to write a secure data in the redundant memory cells, and controls the soft repair circuit to recover the repairing of the first normal memory cells with the redundant memory cells.

The soft repair circuit may repair the first normal memory cells with the redundant memory cells, as the memory device enters a soft post-package repair operation mode, and the soft repair circuit replaces the first normal memory cells with the redundant memory cells, and the memory device exits the soft post-package repair operation mode.

The memory device may write the secure data in the redundant memory cells based on addresses designating the first normal memory cells and a write command provided to the memory device from the memory controller.

The soft repair circuit may recover the repairing of the first normal memory cells with the redundant memory cells, as the memory device enters a soft post-package repair operation mode, and the soft repair circuit cancels the repairing of the first normal memory cells with the redundant memory cells, and the memory device exists the soft post-package repair operation mode.

After recovering the repairing of the first normal memory cells with the redundant memory cells, the memory controller may control the soft repair circuit to repair second normal memory cells of the normal memory cells with the redundant memory cells, and controls the memory device to read the secure data from the redundant memory cells.

The soft repair circuit may repair the second normal memory cells with the redundant memory cells, as the memory device enters a soft post-package repair operation mode, and the soft repair circuit replaces the second normal memory cells with the redundant memory cells, and the memory device exits the soft post-package repair operation mode.

The memory device may read the secure data from the redundant memory cells based on addresses designating the first normal memory cells and a read command provided to the memory device from the memory controller.

BRIEF DESCRIPTION OF THE DRAWINGS

The above and other features and advantages of the present invention will become more apparent to those skilled in the art to which the present invention pertains by the following detailed description with reference to the attached drawings in which:

FIG. 2 is a flowchart describing a method for storing secure data in a memory device in a memory system, in accordance with an embodiment of the present invention.

DETAILED DESCRIPTION

Figure 1:
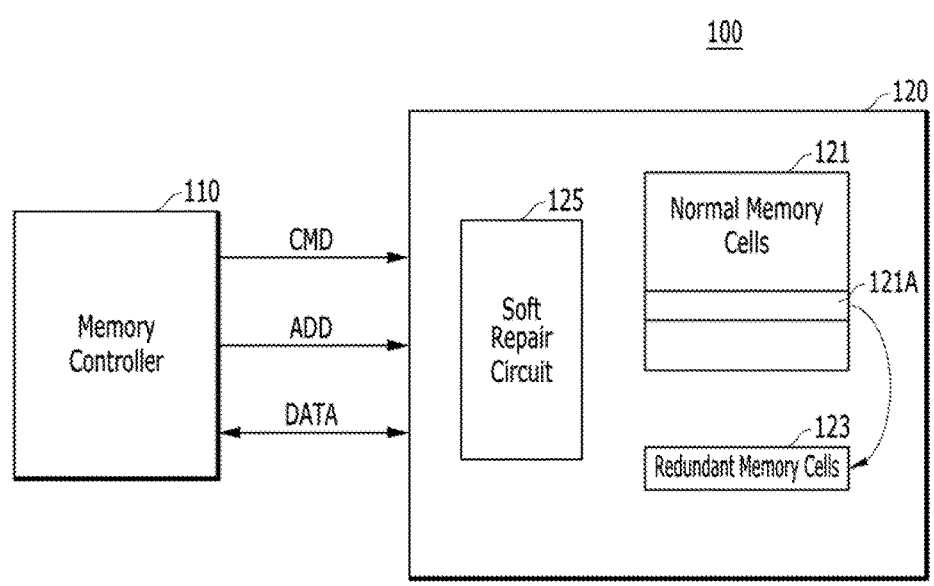
FIG. 1 is a block diagram illustrating a memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram Illustrating a memory system 100 in accordance with an embodiment of the present invention.

Referring to FIG. 1, the memory system 100 may include a memory controller 110 and a memory device 120.

The memory controller 110 may control the memory device 120. The memory controller 110 may control overall operations of the memory device 120 by providing a command CMD and an address ADD to the memory device 120, and by inputting and outputting data DATA to and from the memory device 120.

The memory device 120 may perform diverse operations, such as a read operation and a write operation, under the control of the memory controller 110. The memory device 120 may include a plurality of normal memory cells 121, a plurality of redundant memory cells 123, and a soft repair circuit 125. The memory device 120 may include additional constituent elements other than the illustrated constituent elements 121, 123 and 125. Herein, the constituent elements 121, 123 and 125 that are directly related to a soft post-package repair operation are shown.

The normal memory cells 121 may store data. During write and read operations, normal memory cells that are selected from the normal memory cells 121 based on the address ADD may be accessed and the write and read operations may be performed on the selected normal memory cells. The redundant memory cells 123 may be the memory cells for replacing some memory cells among the normal memory cells 121. For example, defective normal memory cells among the normal memory cells 121 may be replaced with the redundant memory cells 123.

The soft repair circuit 125 may perform a soft post-package repair (SPPR) operation. During the soft post-package repair operation, the addresses of normal memory cells 121A hereinafter, referred to as "target memory cells", which are to be replaced with the redundant memory cells 123, among the normal memory cells 121 are transferred from the memory controller 110 to the soft repair circuit 125, and the soft repair circuit 125 may replace or repair the target memory cells 121A with the redundant memory cells 123. The repair effect of the soft repair circuit 125 is maintained while a power is supplied to the memory device 120, and the repair effect may disappear when the power supply is cut off.

The soft post-package repair operation may be performed not only to repair defective memory cells among the normal memory cells 121 but also to store secure data, which is described hereafter.

FIG. 2 is a flowchart describing a method for storing secure data in the memory device 120 in the memory system 100, in accordance with an embodiment of the present invention.

Referring to FIG. 2, in step S210, the target memory cells 121A of the normal memory cells 121 may be repaired with the redundant memory cells 123. In detail, the memory device 120 enters a soft post-package repair operation mode under the control of the memory controller 110 in step S211, the target memory cells 121A are replaced with the redundant memory cells 123 in step S213, and the memory device 120 exits the soft post-package repair operation mode in step S215. The repair operation according to the steps S211, S213 and S215 may be performed as the memory controller 110 controls the soft repair circuit 125 of the memory device 120 by providing the command CMD and the addresses ADD.

After the target memory cells 121A are replaced with the redundant memory cells 123, a secure data may be written in the redundant memory cells 123 in step S220. The secure data may be written in the redundant memory cells 123, as the memory controller 110 provides the addresses ADD designating the target memory cells 121A, the command indicating a write operation that is, a write command, and the secure data DATA to the memory device 120, and the memory device 120 writes the secure data DATA in the redundant memory cells 123 instead of the target memory cells 121A in response to the addresses ADD and the command CMD.

The repair operation of the step S210 may be recovered in step S230. In detail, the memory device 120 enters the soft post-package repair operation mode under the control of the memory controller 110 in step S231, the replacement of the target memory cells 121A with the redundant memory cells 123 is canceled in step S233, and the memory device 120 exits the soft post-package repair operation mode in step S235. The recovery operation according to the steps S231, S233 and S235 may be performed as the memory controller 110 controls the soft repair circuit 125 of the memory device 120 by providing the command CMD and the addresses ADD.

When the secure data stored in the redundant memory cells 123 needs to be read out, the target memory cells 121A of the normal memory cells 121 may be repaired with the redundant memory cells 123 in step S210_2 and then the secure data stored in the redundant memory cells 123 may be read in step S240.

The operation of the step S210_2 may be performed in the same manner as the operation of the step S210. That is, the memory device 120 enters the soft post-package repair operation mode under the control of the memory controller 110 in step S211_2, the target memory cells 121A is replaced with the redundant memory cells 123 in step S213_2, and the memory device 120 exits the soft post-package repair operation mode in step S215_2. Since the operation of the step S210_2 may be performed to make it possible to access the redundant memory cells 123, the target memory cells 121A in the step S210_2 do not have to be the same as the target memory cells 121A in the step S210.

The operation of the step S240 may be performed as the memory controller 110 provides the addresses ADD designating the target memory cells in the step S210_2 and the command CMD indicating a read operation that is, a read command to the memory device 120, and the memory device 120 reads the secure data from the redundant memory cells 123 and transfers the read secure data to the memory controller 110 in response to the addresses ADD and the command CMD.

Referring to FIG. 2, the target memory cells 121A of the normal memory cells 121 may be replaced with the redundant memory cells 123 in the step S210, and the secure data is written in the redundant memory cells 123 in the step S220. In the step S230, the repairing of the target memory cells with the redundant memory cells 123 is cancelled. Since the repairing is recovered after the secure data is written in the redundant memory cells 123, it is impossible to access the secure data through a general process, and the operations of the steps S210_2 and the S240 have to be performed to access the secure data. Therefore, the secure data may be retained safely. The fact that the operations of the steps S210_2 and the S240 have to be performed to access the secure data may function as a password for accessing the secure data.

According to the embodiments of the present invention, a method for storing secure data in a memory device based on a repair technology.

While the present invention has been described with respect to the specific embodiments, it will be apparent to those skilled in the art that various changes and modifications may be made without departing from the spirit and scope of the invention as defined in the following claims.

What is claimed is:

1. A method for operating a memory device, comprising:
  repairing, in a first soft post-package repair operation, target memory cells of normal memory cells with redundant memory cells, the target memory cells being non-defective memory cells;
  writing a secure data in the redundant memory cells;
  recovering, in a second soft post-package repair operation, the repairing of the target memory cells with the redundant memory cells so that the secure data written in the redundant memory cells is not accessible;
  when the secure data written in the redundant memory cells is requested to be read out, repairing, in a third soft post-package repair operation, the target memory cells of the normal memory cells with the redundant memory cells so that the secure data written in the redundant memory cells is accessible; and
  reading the secure data from the redundant memory cells.

2. The method of claim 1, wherein the repairing of the target memory cells of the normal memory cells with the redundant memory cells includes:
  entering the first soft post-package repair operation mode;
  replacing the target memory cells with the redundant memory cells; and
  exiting the first soft post-package repair operation mode.

3. The method of claim 1, wherein the writing of the secure data in the redundant memory cells includes:
  receiving a write command and an address designating the target memory cells from a memory controller; and
  writing the secure data in the redundant memory cells based on the write command and the address.

4. The method of claim 1, wherein the recovering of the repairing of the target memory cells with the redundant memory cells includes:
  entering the second soft post-package repair operation mode;
  canceling the repairing of the target memory cells with the redundant memory cells; and
  exiting the second soft post-package repair operation mode.

5. The method of claim 1, wherein the repairing of the target memory cells of the normal memory cells with the redundant memory cells includes:
  entering the third soft post-package repair operation mode;
  replacing the target memory cells with the redundant memory cells; and
  exiting the third soft post-package repair operation mode.

6. The method of claim 1, wherein the reading of the secure data from the redundant memory cells includes:
  receiving a read command and an address designating the target memory cells from a memory controller; and
  reading the secure data from the redundant memory cells based on the read command and the address.

7. A memory system comprising:
  a memory device; and
  a memory controller suitable for controlling the memory device, and
  the memory device comprises:
    a plurality of normal memory cells;
    a plurality of redundant memory cells; and
    a soft repair circuit suitable for repairing the normal memory cells with the redundant memory cells,
  wherein, the memory controller is configured to:
    control the soft repair circuit to repair target memory cells of the normal memory cells with the redundant memory cells, the target memory cells being non-defective memory cells,
    control the memory device to write a secure data in the redundant memory cells, and control the soft repair circuit to recover the repairing of the target memory cells with the redundant memory cells so that the secure data written in the redundant memory cells is not accessible,
    control, when the secure data written in the redundant memory cells is requested to be read out, the soft repair circuit to repair the target memory cells of the normal memory cells with the redundant memory cells so that the secure data written in the redundant memory cells is accessible, and then control the memory device to read the secure data from the redundant memory cells.

8. The memory system of claim 7, wherein the soft repair circuit repairs the target memory cells with the redundant memory cells, as the memory device enters a first soft post-package repair operation mode, and the soft repair circuit replaces the target memory cells with the redundant memory cells, and the memory device exits the first soft post-package repair operation mode.

9. The memory system of claim 7, wherein the memory device writes the secure data in the redundant memory cells based on addresses designating the target memory cells and a write command provided to the memory device from the memory controller.

10. The memory system of claim 7, wherein the soft repair circuit recovers the repairing of the target memory cells with the redundant memory cells, as the memory device enters a second soft post-package repair operation mode, and the soft repair circuit cancels the repairing of the target memory cells with the redundant memory cells, and the memory device exists the second soft post-package repair operation mode.

11. The memory system of claim 7, wherein the soft repair circuit repairs the target memory cells with the redundant memory cells, as the memory device enters a third soft post-package repair operation mode, and the soft repair circuit replaces the target memory cells with the redundant memory cells, and the memory device exits the third soft post-package repair operation mode.

12. The memory system of claim 7, wherein the memory device read the secure data from the redundant memory cells based on addresses designating the target memory cells and a read command provided to the memory device from the memory controller.

* * * * *